(12) United States Patent
Arai (10) Patent No.: US 7,944,039 B2
(45) Date of Patent: May 17, 2011

(54) SEMICONDUCTOR DEVICE AND METHOD OF MANUFACTURING THE SAME

(75) Inventor: Tadashi Arai, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/402,862

(22) Filed: Mar. 12, 2009

(65) Prior Publication Data
US 2009/0250803 A1 Oct. 8, 2009

(30) Foreign Application Priority Data

Apr. 3, 2008 (JP) .................................. 2008-96800

(51) Int. Cl.
*H01L 23/48* (2006.01)
*H01L 23/52* (2006.01)
*H01L 29/40* (2006.01)
*H01L 23/28* (2006.01)

(52) U.S. Cl. ......... 257/690; 257/780; 257/784; 257/787

(58) Field of Classification Search .................. 257/690, 257/779, 780, 784, 787, 774, 775
See application file for complete search history.

(56) References Cited

U.S. PATENT DOCUMENTS 5,969,426 A * 10/1999 Baba et al. .................... 257/778
6,071,755 A 6/2000 Baba
6,317,333 B1 * 11/2001 Baba .............................. 257/700
6,879,034 B1 * 4/2005 Yang et al. .................... 257/700
6,952,049 B1 * 10/2005 Ogawa et al. ................. 257/700

FOREIGN PATENT DOCUMENTS

JP 8-167629 6/1996

OTHER PUBLICATIONS

"Bumpless Build-Up Layer Packaging" / The related part: Figure 1 ASME International Mechanical Engineering Congress and Exposition (IMECE) (Nov. 11, 2001).

* cited by examiner

*Primary Examiner* — Chuong A. Luu
(74) *Attorney, Agent, or Firm* — Kratz, Quintos & Hanson, LLP (57) ABSTRACT

A semiconductor device includes a chip, a laminated wiring structure formed integrally with the chip, a frame disposed to surround the chip and made of a material having stiffness, and a sealing resin formed to bury therein the frame and at least the periphery of the side surface of the chip. The laminated wiring structure includes a required number of wiring layers, which are formed by patterning in such a manner that a wiring pattern directly routed from an electrode terminal of the chip is electrically connected to pad portions for bonding external connection terminals, the pad portions being provided, at a position directly below a mounting area of the chip and at a position directly below an area outside the mounting area, on a surface to which the external connection terminals are bonded.

3 Claims, 5 Drawing Sheets

TO STEPS OF FIGS 3A TO 3D

FIG. 5

SEMICONDUCTOR DEVICE AND METHOD OF MANUFACTURING THE SAME

CROSS-REFERENCE TO RELATED APPLICATIONS

This application is based on and claims priority of Japanese Patent Application No. 2008-96800 filed on Apr. 3, 2008, the entire contents of which are incorporated herein by reference.

BACKGROUND OF THE INVENTION (a) Field of the Invention

The present invention relates to a semiconductor device and a method of manufacturing the same, and more particularly to a semiconductor device having a wiring board for use in mounting a semiconductor element or the like, and a method of manufacturing the same.

Note that the "wiring board" is hereinafter also referred to as a "semiconductor package" or merely a "package" for the sake of convenience, because the wiring board plays the role of mounting a semiconductor element or the like thereon.

(b) Description of the Related Art

A semiconductor package such as a ball grid array (BGA), a land grid array (LGA) or a pin grid array (PGA) generally has a multilayer wiring structure. The multilayer wiring structure is obtained, for example, by build-up process sequentially repeating the formation of a conductive pattern (wiring layer), the formation of an insulating layer, and the formation of a via hole in the insulating layer, on both surfaces of a core board provided as a base material for the semiconductor package. Finally, the outermost wiring layer is coated with a protection film, and an opening is formed at a required position in the protection film while a portion of the conductive pattern is exposed as a pad portion. In the case of the BGA or the PGA, a ball, a pin or the like which functions as an external connection terminal is further bonded to the exposed pad portion.

A semiconductor package of this type has a semiconductor element such as an IC chip mounted on a surface thereof with a conductive material such as solder therebetween. The semiconductor package with the semiconductor element mounted thereon is then packaged on a packaging object such as a motherboard or a socket component with an external connection terminal (such as a ball or a pin) therebetween, the external connection terminal provided on the other surface of the semiconductor package. Namely, the semiconductor element is electrically connected to the motherboard or the like with the semiconductor package therebetween.

Meanwhile, as demands for miniaturization and multiple functions in electronic equipment or an electronic device grow recently, a semiconductor device for use in the electronic equipment or the electronic device has been smaller in size, higher in packaging density, and higher in pin count (higher in terminal count). With this demand, a semiconductor device, called a chip size package or a die size package, has been developed and come into practical use, which is designed to achieve miniaturization by bringing the shape of the semiconductor device as close to that of an individual semiconductor element (chip) as possible.

An example of technology related to the above-mentioned prior art is described in Japanese unexamined Patent Publication (JPP) (Kokai) 8-167629. This publication discloses a semiconductor device, which includes a sealing resin to seal a semiconductor substrate, a lead pattern transferred to the underside of the sealing resin, and a plurality of external electrodes formed on the underside of the lead pattern.

Of the prior art semiconductor packages as mentioned above, the chip size package (die size package) has attracted attention in the course of development of recent downsizing; however, such a chip size package may possibly be deficient in the number of terminals under restrictions on a chip (die) size and a terminal pitch.

Namely, the increase in integration density per chip leads to the increase in the number of inputs and outputs, and to a need for a larger number of external connection terminals. A semiconductor package having an active IC chip such as a microprocessor unit (MPU) mounted thereon, in particular, requires a significantly larger power supply current. For this reason, a larger number of external connection terminals are assigned to the power supply to the chip in the semiconductor package, which account for more than half of the total terminals of the package. Namely, only less than half terminals thus left are available as inputs and outputs for signals.

On the other hand, the miniaturization of the package leads to a limited number of external connection terminals which can be built in the package. Accordingly, under the current circumstances, the prior art chip (die) size package has difficulty in ensuring a sufficient number of external connection terminals.

Furthermore, the mounting of the semiconductor element such as an IC chip on the semiconductor package involves: connecting an electrode terminal of the chip to the pad portion exposed on the chip mounting surface of the package, by flip chip bonding, using a conductive material such as solder; filling an underfill resin into a gap between the package and the chip; and heat-curing and thus setting the resin. At the time of heat curing, a difference in the coefficient of thermal expansion between the resin and the board causes a shrinkage in the underfill resin, resulting in warpage in the package affected by the shrinkage.

To reduce such "warpage" resulting from a cure shrinkage in the underfill resin at the time of chip mounting, the package (wiring board) needs to be configured in a considerable thickness (i.e. in multiple layers). Also, such a package generally has a multilayer structure under restrictions on the width of a wiring pattern or a via contact (interlayer connection) and thus has disadvantage of impairing the thinning (miniaturization) of the overall package.

SUMMARY OF THE INVENTION

An object of the present invention is to provide a semiconductor device and a method of manufacturing the same, which satisfies, when needed, a need to increase the number of external connection terminals with a demand for a high packaging density or the like, and can eliminate a warpage of a package, while achieving miniaturization.

According to one aspect of the invention, there is provided a semiconductor device including: a semiconductor element; a laminated wiring structure formed integrally with the semiconductor element; a frame disposed to surround the semiconductor element on the laminated wiring structure, and made of a material having stiffness; and a sealing resin formed to bury therein the frame and at least the periphery of a side surface of the semiconductor element, wherein the laminated wiring structure includes a required number of wiring layers, and the wiring layers are formed by patterning in such a manner that a wiring pattern directly routed from an electrode terminal of the semiconductor element is electrically connected to pad portions for bonding external connection terminals, the pad portions being provided, at a position directly below a mounting area of the semiconductor element and at a position directly below an area outside the mounting area, on a surface to which the external connection terminals are bonded.

According to the configuration of the semiconductor device of the present invention, the laminated wiring structure formed integrally with the semiconductor element functions as a package mounting the semiconductor element thereon, and the wiring layers which constitute the package are formed by patterning in such a manner that the wiring pattern directly routed from the electrode terminal of the semiconductor element is electrically connected to pad portions for bonding external connection terminals, the pad portions being provided, at a position directly below a mounting area of the semiconductor element and at a position directly below an area outside the mounting area, on the surface to which the external connection terminals are bonded. Even if there arises a need to increase the number of external connection terminals with a demand for high packaging density or the like, such a configuration of the package is sufficiently adaptable to the demand.

Also, the frame made of the material having stiffness is disposed to surround the semiconductor element so that the stiffness of the overall package is improved. Accordingly, a disadvantage of the package becoming "warped", such as encountered in the prior art, does not arise. Moreover, the package is prevented from being warped without having the multilayer structure as has been conventional, and thus thinning (miniaturization) of the package can be achieved.

According to another aspect of the invention, there is provided a method of manufacturing a semiconductor device, including the steps of: preparing a plate-shaped frame attached to a tape-shaped base material, the frame being made of a material having stiffness, and having an opening of a required size formed therein; mounting a semiconductor element in a face-down mounting manner, on a portion corresponding to the opening in the frame on the tape-shaped base material; sealing the frame and at least the periphery of a side surface of the semiconductor element with a sealing resin; removing the tape-shaped base material; forming a wiring pattern to be directly connected to an electrode terminal of the semiconductor element, and thereafter stacking a required number of wiring layers one on top of another, the required number of wiring layers being formed by patterning in such a manner that the wiring pattern is electrically connected to pad portions for bonding external connection terminals, the pad portions being provided, at a position directly below a mounting area of the semiconductor element and at a position directly below an area outside the mounting area, on a surface to which the external connection terminals are bonded; and forming a protection film to expose the pad portions for bonding external connection terminals.

With reference to the following embodiments of the invention, description is given below of other features in configuration of the semiconductor device and the method of manufacturing the same according to the present invention, characteristic advantages based on the features thereof, and so on.

DESCRIPTION OF THE PREFERRED EMBODIMENTS

Description is given below of preferred embodiments of the present invention with reference to the accompanying drawings.

Figure 1:
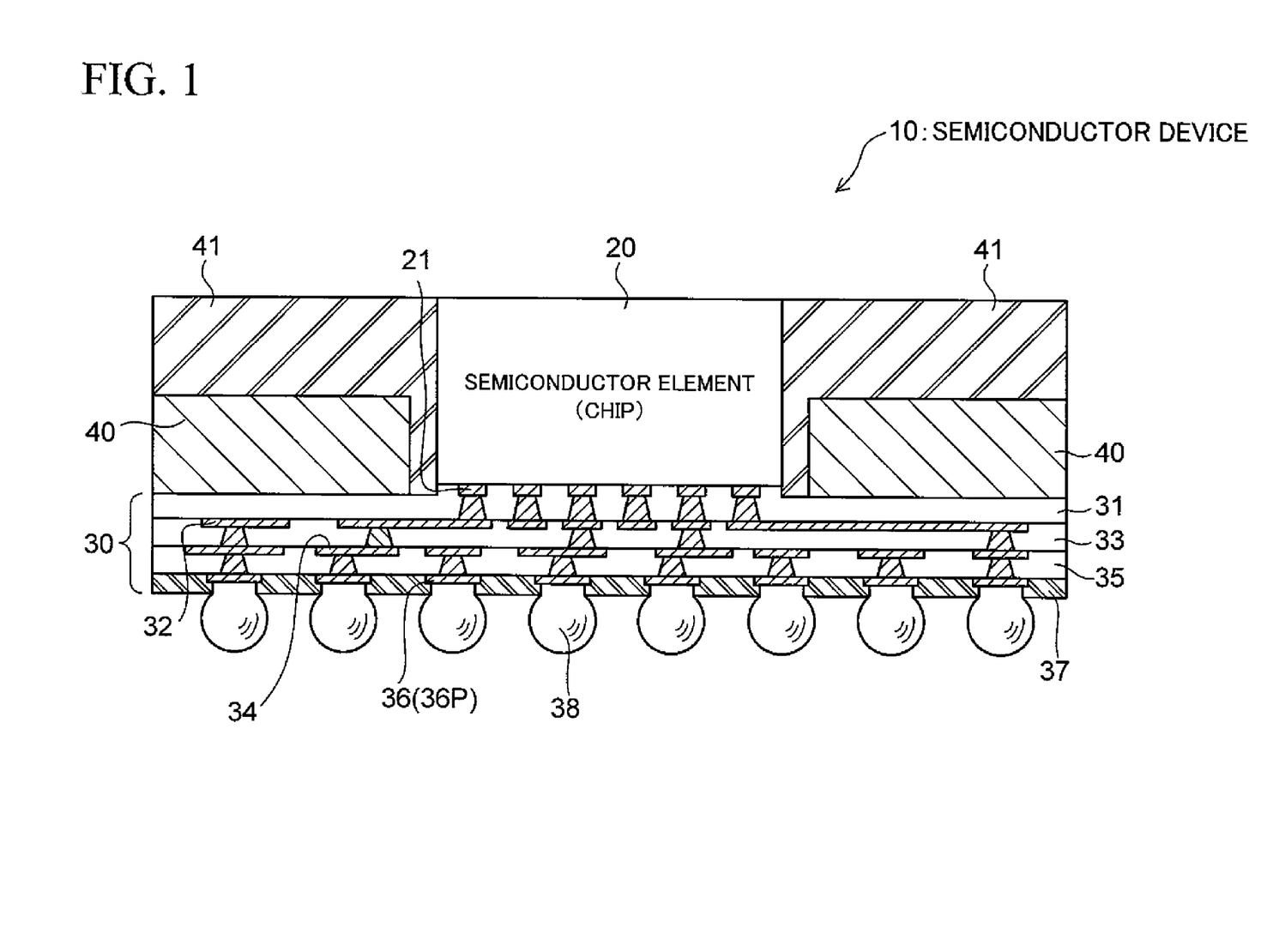
FIG. 1 is a sectional view showing the configuration of a semiconductor device provided with a package having a fan-out structure according to one embodiment of the present invention.

FIG. 1 shows in sectional view the configuration of a semiconductor device provided with a package having a fan-out structure according to one embodiment of the present invention.

A semiconductor device 10 according to the embodiment of the present invention is basically provided with a chip 20 (typically, a silicon (Si) chip) such as a semiconductor element, a laminated wiring structure 30 provided integrally with the chip 20, a frame 40 disposed on the laminated wiring structure 30 to surround the periphery of the side surface of the chip 20, and a sealing resin 41 formed to coat the overall surface of the frame 40 and the periphery of the side surface of the chip 20 (or to bury the overall chip 20 therein).

The semiconductor chip 20 built in the semiconductor device 10 is a chip (also referred to as "die") obtained by dicing, in units of device, a wafer having a plurality of devices fabricated therein using a process for a wafer level package, as described later.

The laminated wiring structure 30 is functionally equivalent to a "wiring board (package)" or an "interposer" as having the roll to allow the semiconductor chip 20 to be mounted thereon as shown in FIG. 1. The laminated wiring structure 30 has a structure in which wiring layers (wiring layers 32, 34 and 36 in the example shown in FIG. 1) as many as necessary are stacked one on top of another with insulating layers 31, 33 and 35 interposed therebetween and the stacked wiring layers are interconnected with conductors (which are formed by part of material included in the wiring layers 32, 34 and 36) filled into via holes formed in the insulating layers 31, 33 and 35 interposed therebetween. The innermost wiring layer (the uppermost wiring layer 32 in the example shown in FIG. 1) of the laminated wiring structure 30 is directly routed from an electrode terminal 21 (such as a solder bump or a gold (Au) bump) of the semiconductor chip 20 mounted on the laminated wiring structure 30. Namely, the wiring layer 32 is formed by patterning to be connected to the electrode terminal 21. Copper (Cu) is typically used as a material for the wiring layers 32, 34 and 36, and an epoxy resin, a polyimide resin or the like is used as a material for the insulating layers 31, 33 and 35.

Also, the outermost wiring layer (the lowermost wiring layer 36 in the example shown in FIG. 1) of the laminated wiring structure 30 has pad portions 36P defined at predetermined positions. The pad portions 36P are disposed as shown in FIG. 1, not only on a portion directly below a chip mounting area but also on a portion corresponding to an area outside the portion directly below the chip mounting area. Moreover, a solder resist layer 37 is formed as a protection film to coat the surface of the laminated wiring structure 30 with the pad portions 36P being exposed.

The pad portion (Cu) 36P is plated with nickel (Ni) and gold (Au) in this order, since an external connection terminal 38 such as a solder ball for use in mounting the device 10 on a printed wiring board (i.e., a packaging board) such as a motherboard is bonded to the pad portion 36P exposed from the solder resist layer 37. This is for the purpose of improving contact bonding properties when the external connection terminal 38 is bonded to the pad portion 36P (i.e., Au layer), and for the purpose of enhancing adhesion between the Au layer and the pad portion (Cu) 36P and thereby preventing Cu from diffusing into the Au layer (i.e., Ni layer). Namely, the pad portion 36P has a three-layer structure of Cu, Ni and Au.

Incidentally, the external connection terminal 38 is provided on the pad portion 36P in the illustrated example; however, the provision of the external connection terminal 38 is not necessarily required. It is sufficient only that the pad portion 36P be exposed so as to allow the external connection terminal to be bonded thereto when necessary.

As mentioned above, the laminated wiring structure 30 is used for providing alignment (rewiring) between the electrode terminals 21 of the semiconductor chip 20 mounted thereon and the external connection terminals 38 to be connected to the motherboard or the like, and has a form, a so-called "fan-out structure", in which an area of the external connection terminals 38 is extended around the chip mounting area as shown in FIG. 1. Namely, the external connection terminals 38 are provided in a "grid array" form throughout the entire mounting surface of the device 10.

On the other hand, the frame 40 disposed around the chip 20 on the laminated wiring structure 30 is made of a material having sufficient mechanical strength (stiffness), as functioning as a stiffener (a reinforcing member) to prevent warpage in the device 10 (specifically, the laminated wiring structure 30), as described later. Preferably, it is desirable that the frame 40 be made of a material having a low coefficient of thermal expansion. For example, iron (Fe) or an alloy thereof (such as an alloy of 42% nickel (Ni) and Fe), copper (Cu) or an alloy thereof (such as an alloy of Cu, iron (Fe) and phosphorus (P)), or the like, which are generally used as a base material for a lead frame can be used. A glass epoxy resin which constitutes a core material for a build-up wiring board, or the like may be used in place of such a metal material.

The sealing resin 41 formed to coat the frame 40 and the periphery of the side surface of the semiconductor chip 20 (or to bury the overall chip 20 therein) is used for keeping and fixing an integral structure of the chip 20, the laminated wiring structure 30 and the frame 40. A thermosetting epoxy resin generally used as a molding resin, a liquid epoxy resin generally used as an underfill resin, or the like, for example, can be used as a material for the sealing resin 41.

As mentioned above, the semiconductor device 10 according to the present embodiment is characterized in that: the device 10 is in such a form that the semiconductor chip 20 is integral with the laminated wiring structure 30 functioning as the package; the chip 20 is buried in the sealing resin 41 to have a surface exposed, the surface being opposite to that on which the electrode terminals 21 of the chip 20 are formed (or the overall chip 20 is buried in the sealing resin 41); and further, a wiring pattern is directly routed from the electrode terminal 21 of the chip 20 and the external connection terminals 38 (the pad portions 36P) are disposed not only on the portion directly below the chip mounting area but also on the portion corresponding to the area outside the portion directly below the chip mounting area with the rewiring by the laminated wiring structure 30. Moreover, the semiconductor device 10 is characterized in that the frame 40 (the stiffener) is disposed to surround the periphery of the side surface of the chip 20 on the package (namely, the laminated wiring structure 30).

Next, description is given of a method of manufacturing the semiconductor device 10 according to the present embodiment (FIG. 1) with reference to FIGS. 2A to 2E and FIGS. 3A to 3D showing an example of a manufacturing process for the semiconductor device 10. Note that, in sectional views showing steps of FIG. 3A and the following drawings, part of the configuration shown in FIG. 1 (namely, a portion of the laminated wiring structure 30) is shown in simplified form.

First, at the first step (see FIG. 2A), prepared is the frame 40 having an opening OP larger than the size (die size) of the chip to be mounted. Any material may be used as the material for the frame 40, as far as the material has sufficient mechanical strength (stiffness) as well as a low coefficient of thermal expansion, as mentioned above. For example, prepared is a thin plate of copper (Cu) used as the base material for the lead frame, and the rectangular opening OP of the required size is formed in the metal (Cu) plate by pressing or etching. In the example shown in FIG. 2A, only one opening OP (one frame 40) is shown for the sake of simplicity; however, a plurality of openings OP (a plurality of frames 40) are actually arranged.

Figure 2A:
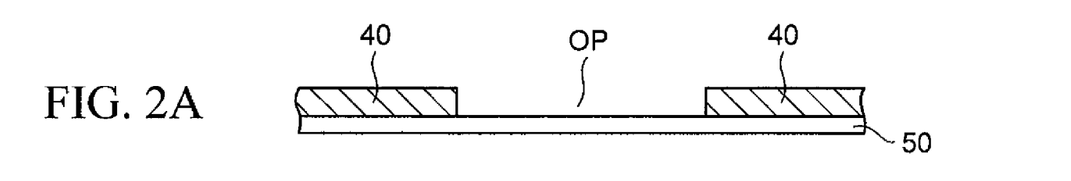
FIGS. 2A to 2E are sectional views illustrating an example of a manufacturing process for the semiconductor device shown in FIG. 1.

Then, the frame 40 prepared in this manner is attached to the surface of a base material (e.g., a tape 50 such as a polyimide resin) to which an adhesive is applied, the base material being shaped in tape form with the adhesive applied on one surface. The tape 50 functions as a base material to temporarily allow the chip 20 to be mounted thereon at a defined position as described later.

At the next step (see FIG. 2B), a silicon chip 20 fabricated in advance at a different step is mounted on the tape 50 in a portion corresponding to the opening OP in the frame 40, in such a manner that a surface which constitutes a circuit (i.e., the surface on which the electrode terminals 21 are formed) is faced down, i.e., in a face down mounting manner (i.e., die attach).

Figure 2B:
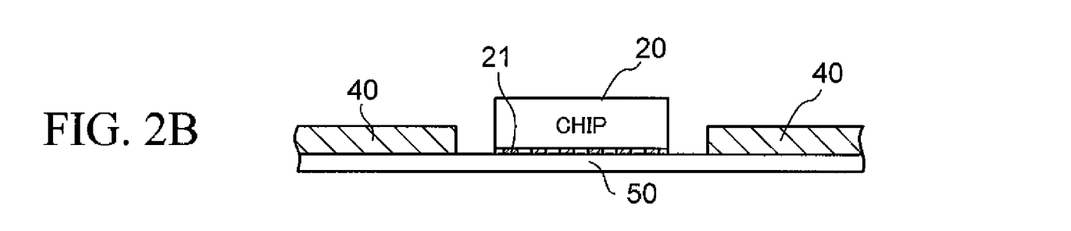

A process for a wafer level package can be used to fabricate the chip 20 to be mounted. The chip (die) 20 with the electrode terminals 21 exposed on one surface as shown in FIG. 2B can be obtained, for example, in the following manner. Specifically, one surface of a silicon wafer of a predetermined size (e.g., 8 inches or 12 inches) is subjected to a required device process to make an array of a plurality of devices; a passivation film made of silicon nitride (SiN), phosphorus glass (PSG) or the like is formed on the surface on which the devices are formed; by a laser or the like, the passivation film is partially removed at a portion corresponding to a pad (the electrode terminal 21) defined in part of a wiring layer of aluminum (Al) shaped in a required pattern on each device; the wafer is thinly grinded to a predetermined thickness; and then the wafer is diced into units of devices by a dicer or the like.

At the time of dicing the wafer into units of devices, the wafer is mounted on a dicing tape supported on a dicing frame, with a die attach film interposed therebetween, with the surface of the wafer opposite to that on which the devices are formed, attached to the dicing tape. The wafer is then cut by a blade of the dicer along a line which defines each device region, and thereafter, the cut and divided chips (dies) 20 are picked up. At that time, each individual chip (die) 20 has the die attach film attached thereto; however, illustration of the die attach film is omitted in the example shown in FIG. 2B.

At the time of mounting the chip (die) 20 at the defined position on the tape 50, for example, an alignment mark previously given to the frame 40 is read by a microscope or the like, and the chip 20 is mounted according to the detected position.

At the next step (see FIG. 2C), the chip 20 is sealed by a sealing resin 41 so that the frame 40 attached to the tape 50 and the periphery of the side surface of the mounted chip 20 are coated with the sealing resin 41. This can be accomplished using a mold (a top force and a bottom force) to perform compression molding by heat and pressure.

Figure 2C:
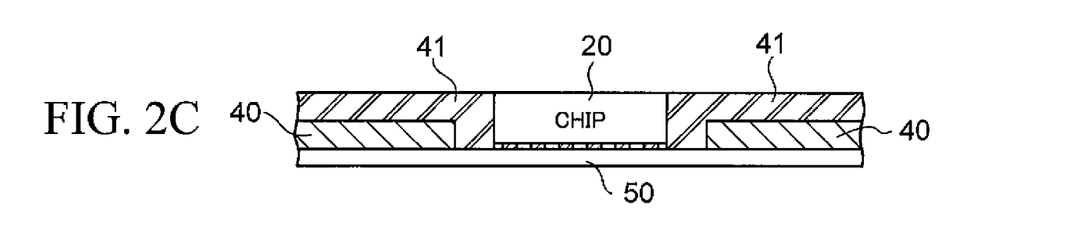
Figure 2D:
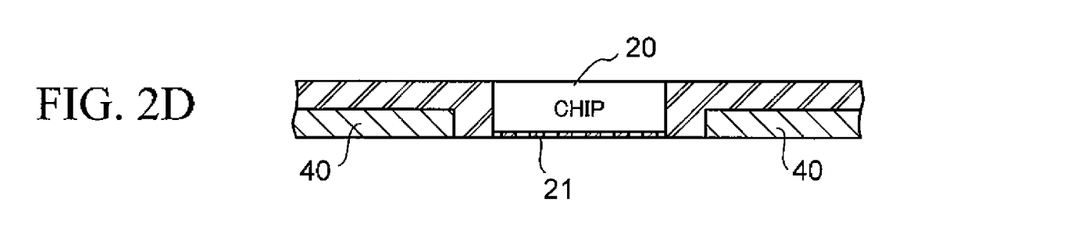
Figure 2E:
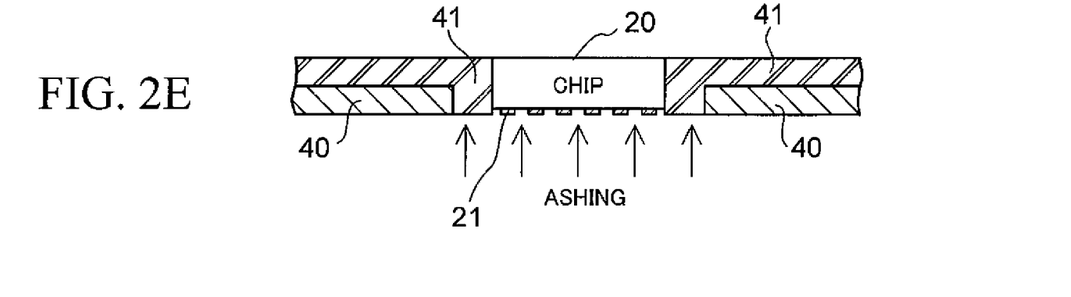

The thermosetting epoxy resin used as the molding resin, the liquid epoxy resin used as the underfill resin, or the like can be used as the material for the sealing resin 41. Also, the sealing resin 41 is not limited to a liquid form, but may be in a tablet or a powder form. Transfer molding, injection molding, potting, or the like can be employed as a filling method for the sealing resin 41, Alternatively, printing may be employed to apply a coating method of a paste resin.

Incidentally, where the sealing resin 41 partially remains on the back surface of the chip 20 (i.e., on the surface opposite to that on which the electrode terminals 21 are formed) when being filled at the step of FIG. 2C, the resin surface may be polished, for example, by mechanical polishing to thereby expose the back surface of the chip 20.

Also, in the step of FIG. 2C, resin sealing is performed in such a manner that the back surface of the chip 20 is exposed; however, the exposure of the back surface of the chip 20 is not necessarily required, depending on the amount of power consumed by a chip to be mounted. For example, where the chip to be mounted is one which consumes less power, unlike a microprocessor unit (MPU), the chip produces only a small amount of heat, and thus the overall chip may be buried in the resin from the viewpoint of chip protection.

At the next step (see FIG. 2D), the tape 50 (see FIG. 2C) made of polyimide resin or the like utilized as the base material to temporarily allow the chip 20 to be mounted thereon is delaminated and removed. At this stage, a portion of the adhesive applied to the delaminated tape 50 can possibly remain on the surface of the chip 20 on which the electrode terminals 21 are formed (on the lower surface in the illustrated example).

At the next step (see FIG. 2E), the possible remaining adhesive is removed, for example, by ashing (i.e., dry etching using $O_2$ plasma). Thereby, the electrode terminals 21 of the chip 20 as well as the frame 40 are exposed.

Figure 3A:
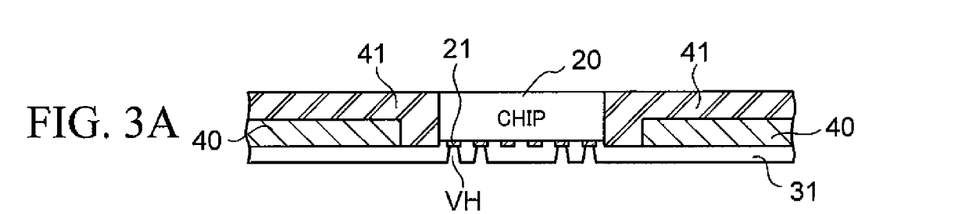
FIGS. 3A to 3D are sectional views illustrating a manufacturing process following the process shown in FIGS. 2A to 2E.

At the next step (see FIG. 3A), an insulating layer 31 is formed on the surface on which the electrode terminals 21 of the chip 20 and the frame 40 are exposed, and an opening VH is formed at a predetermined position. The insulating layer (polyimide resin layer) 31 having the opening VH at the predetermined position as shown in FIG. 3A is formed in a following manner. Specifically, a photosensitive polyimide resin is applied to the surface of the chip 20 on which the electrode terminals 21 are formed, by photolithography; the polyimide resin is subjected to soft baking (pre-baking); then exposure and development (i.e., patterning of the polyimide resin layer) is performed using a mask (not shown); and further, hard baking (post-baking) is performed. At that time, the patterning of the polyimide resin layer is performed according to the layout (arrangement) of the electrode terminals 21 of the chip 20. Therefore, when the exposure and the development are performed, a portion of the polyimide resin layer 31 corresponding to the electrode terminal 21 is removed, so that the opening VH reaching the electrode terminal 21 is formed.

At the next step (see FIG. 3B), a wiring layer (pattern) 32 of a required shape is formed by semi-additive process or the like so as to fill the opening VH and to be connected to the electrode terminal 21. A specific example is described below.

Figure 3B:
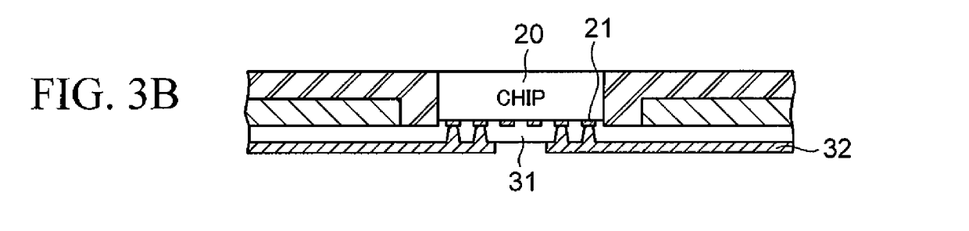
Figure 3C:
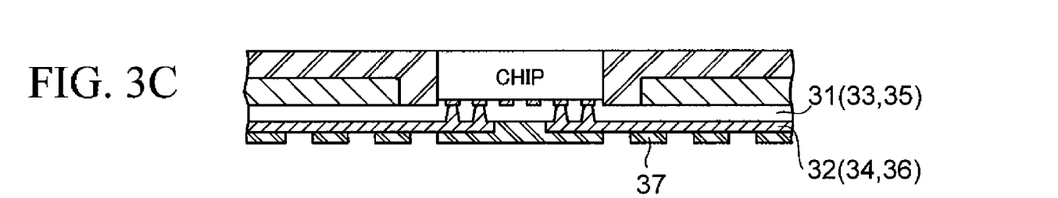
Figure 3D:
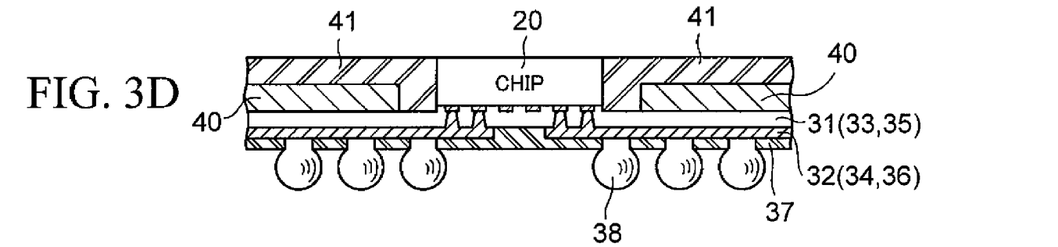
Figure 4A:
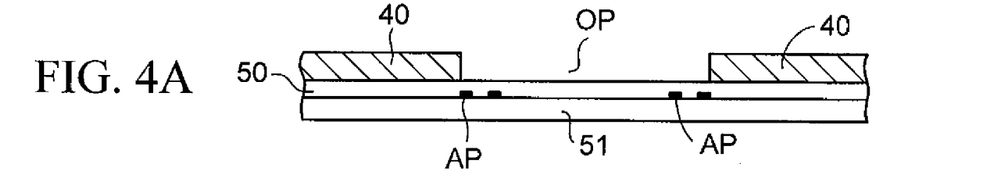
FIGS. 4A to 4E are sectional views illustrating another example of a manufacturing process for the semiconductor device shown in FIG. 1.
Figure 4B:
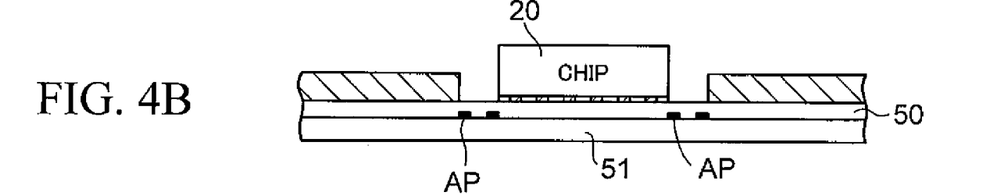
Figure 4C:
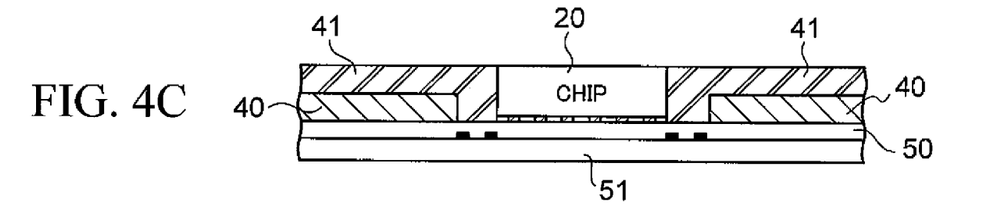
Figure 4D:
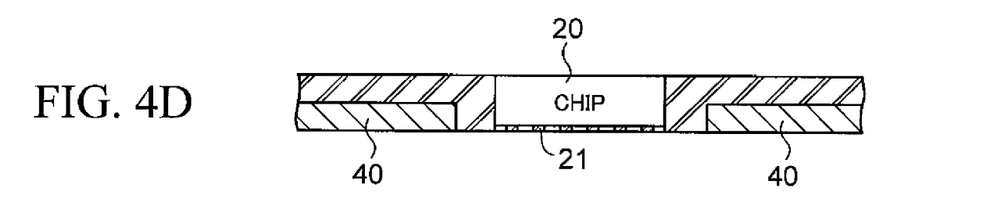
Figure 4E:
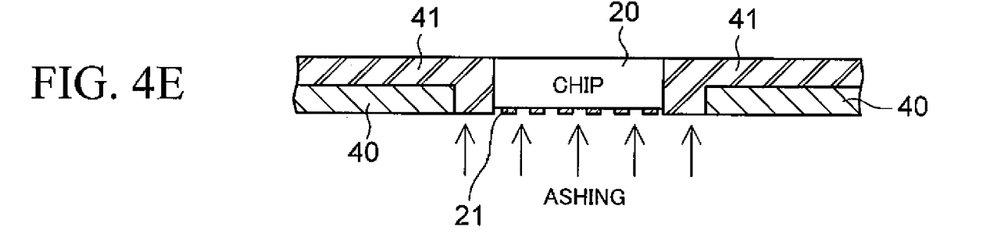

First, a seed layer is formed over the entire surface on which the insulating layer 31 is formed, by sputtering, electroless plating, or the like. For example, the seed layer of a two-layer structure can be formed by sputter-depositing chromium (Cr) or titanium (Ti) over the entire surface (a contact metal layer, i.e., a Cr layer or a Ti layer), and further, sputter-depositing copper (Cu) on the Cr or Ti layer. Then, the surface of the seed layer (i.e., the surface of the Cu layer) is dehydrated and baked; a liquid photoresist is applied and dried; and then exposure and development (i.e., patterning of the photoresist) is performed using a mask (not shown) to thereby form a resist layer. The patterning of the photoresist is performed according to the layout of the wiring pattern to be formed. Instead of the liquid photoresist, a photosensitive dry film may be attached and subjected to patterning.

Subsequently, a Cu wiring layer (rewiring layer) 32 is formed in a required form by Cu electroplating utilizing the seed layer as a power feed layer, using as a mask the resist layer formed by patterning. Thereafter, the photoresist is removed using a remover containing an organic solvent. Where a dry film is used in place of the photoresist, an alkaline chemical liquid such as sodium hydroxide (NaOH) or monoethanolamine is used to delaminate and remove the dry film.

Moreover, the exposed seed layer is removed by wet etching. In this case, first, the Cu layer in an upper layer portion of the seed layer is removed by an etchant which dissolves Cu, and then, the contact metal layer (i.e., the Cr layer or the Ti layer) in a lower layer portion thereof is removed by an etchant which dissolves Cr or Ti. Thereby, the insulating layer 31 is exposed as shown in FIG. 3B. Thereafter, predetermined surface cleaning or the like is performed.

Incidentally, when the etchant which dissolves Cu is used, it seems that Cu which forms the rewiring layer 32 is also removed and the pattern is disconnected; however, such a disadvantage does not actually arise. The reason is as follows: as mentioned above, the upper layer portion of the seed layer is formed by Cu sputtering and thus has a layer thickness of the submicron order, while the rewiring layer 32 is formed by Cu electroplating and thus has a layer thickness of the order of at least 10 µm. Accordingly, even if Cu of the seed layer is completely removed, the rewiring layer 32 (Cu) only has its top surface portion removed, so that the rewiring pattern is not disconnected.

After the wiring layer 32 to be connected to the electrode terminals 21 of the chip 20 is formed by filling the opening VH as mentioned above, the like processes as those performed at the steps of FIGS. 3A and 3B are repeated to stack the insulating layers 33 and 35 and the wiring layers 34 and 36 alternating with each other, one on top of another, until the required number of layers is reached, to thereby form the laminated wiring structure 30 (see FIG. 1).

At the next step (see FIG. 3C), the solder resist layer 37 is formed by coating the entire surface so that the pad portions 36P defined at the predetermined positions on the outermost wiring layer 36 are exposed. Moreover, the exposed pad portions 36P are plated with Ni and Au.

At the final step (see FIG. 3D), a flux serving as a surface treatment agent is applied to the pad portions 36P exposed from the solder resist layer 37, and then solder balls for use as the external connection terminals 38 are mounted and are fixed by reflow soldering at a temperature of 240 to 260 degrees. Thereafter, the flux is removed by cleaning the surface.

Moreover, the wafer is divided into units of individual devices (each of which is a portion including one chip 20 and the frame 40 disposed around the chip 20) by the dicer or the like, to obtain the semiconductor device 10 (FIG. 1) according to the present embodiment.

As described above, according to the semiconductor device 10 (FIG. 1) of the present embodiment and the method of manufacturing the same (FIGS. 2A to 2E and FIGS. 3A to 3D), the laminated wiring structure 30 formed integrally with the semiconductor chip 20 functions as the package which allows the chip 20 to be mounted thereon, and the required number of the wiring layers 32, 34 and 36 which constitute the package are formed by patterning in such a manner that the wiring pattern (the wiring layer 32) directly routed from the electrode terminal 21 of the chip 20 is electrically connected to the external connection terminals 38 (the pad portions 36P) provided both on the portion directly below the chip mounting area and on the portion corresponding to the area outside the portion directly below the chip mounting area. Such a configuration enables achieving the package of the fan-out structure (i.e., the laminated wiring structure 30) which has been unfeasible with the prior art die size package. Therefore, even if there arises a need to increase the number of external connection terminals with the demand for high packaging density and multiple terminals, the device and the method of the present invention are sufficiently adaptable to the need.

Also, a thin film wiring rule (the process for the wafer level package) can be used to form the wiring layers 32, 34 and 36 which constitute the laminated wiring structure 30, which facilitates fine wiring and thus enables minimizing the number of layers. This contributes to a thinning of the package and hence to miniaturization of the package.

In addition, the frame 40 having sufficient mechanical strength is disposed to surround the periphery of the side surface of the mounted chip 20, and the frame 40 and the chip 20 are buried and fixed in the sealing resin 41. Accordingly, the stiffness of the overall package is improved. Thereby, for example, when the device 10 is mounted on the interposer or the like, even if stress is produced at an interface between the device and the interposer, depending on a difference in the coefficient of thermal expansion between the device and the interposer, incident to the heat curing of the underfill resin filled into a gap between the device and the interposer, the frame 40 interposed therebetween reinforces the overall package and thus eliminates a disadvantage of the package becoming "warped."

Additionally, the back surface of the mounted chip 20 (i.e., the surface opposite to that on which the electrode terminals 21 are formed) is exposed, and thus, heat produced by the chip 20 can be dissipated directly to the outside, which is advantageous in a heat dissipation effect. This is effective in particular when a chip which consumes high power, such as a microprocessor unit (MPU), is mounted.

In the method of manufacturing the semiconductor device 10 according to the above-mentioned embodiment (see FIGS. 2A to 2E and FIGS. 3A to 3D), when at the die attach step (FIG. 2B), the chip (die) 20 is mounted at the defined position on the tape 50, the alignment mark given to the copper (Cu) plate (the frame 40) serving as the base material for the lead frame is read by the microscope or the like in order to align the chip 20; however, the alignment mark on a member such as the copper (Cu) plate which is an object to which the mark is given is not necessarily read with high accuracy when the position of the mark is read by the microscope or the like. In view of this, with reference to FIGS. 4A to 4E, description is given of an embodiment in which improvement is made on this respect.

FIGS. 4A to 4E show another example of a manufacturing process for the semiconductor device 10 (FIG. 1) according to the present embodiment, and correspond to the steps shown in FIGS. 2A to 2E.

A manufacturing method according to the improved embodiment (FIGS. 4A to 4E) is different from the manufacturing method according to the above-mentioned embodiment (FIGS. 2A to 2E) in the following points. Specifically, the different points are: at the first step (see FIG. 4A), when the frame 40 having the opening OP is attached to the tape 50 such as polyimide resin, a base material 51 (e.g., a silicon board, a glass board, or the like) having a highly accurate alignment pattern AP (e.g., 1 µm or less) previously formed thereon by using a thin film wiring process is disposed under the tape 50; at the next step (see FIG. 4B), when the die attach is performed, the alignment pattern AP through which the tape 50 can be seen is read by the microscope or the like, and the chip (die) 20 is mounted according to the pattern position; and at the step shown in FIG. 4D, when the tape 50 is delaminated, the base material 51 with the alignment pattern AP is also delaminated. Since other steps are the same as those of the manufacturing method according to the above-mentioned embodiment (see FIGS. 2A to 2E and FIGS. 3A to 3D), description thereof is omitted.

According to the manufacturing method shown in FIGS. 4A to 4E, the high accurate alignment pattern AP formed using the thin film wiring process is read to align the chip 20, and thus the manufacturing method further has an advantage of enabling the high-accuracy arrangement of the chips 20 to be mounted on the tape 50, in addition to the advantageous effects achieved by the manufacturing method according to the above-mentioned embodiment (see FIGS. 2A to 2E and FIGS. 3A to 3D).

Figure 5:
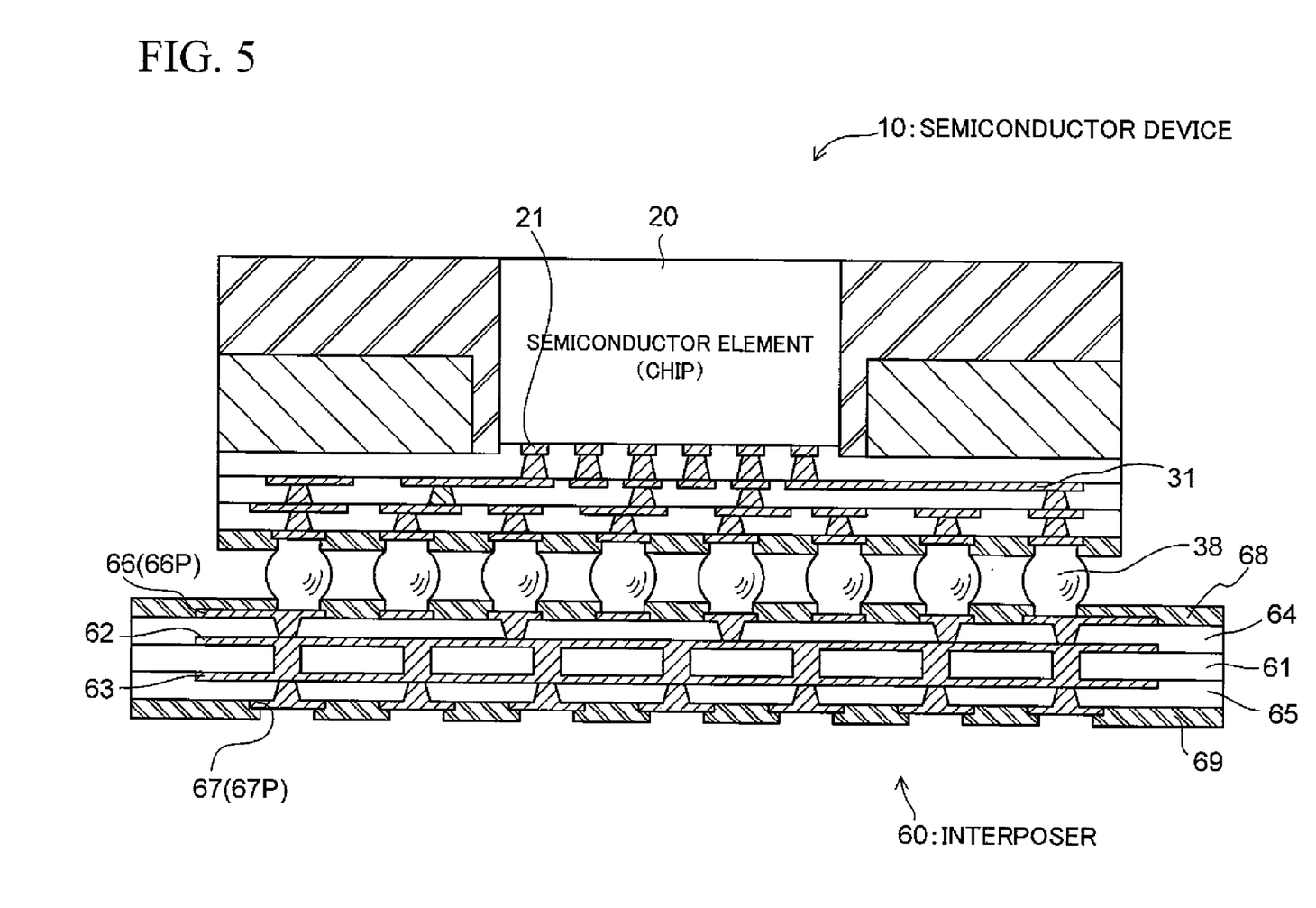
FIG. 5 is a sectional view illustrating an example of application of the semiconductor device shown in FIG. 1.

FIG. 5 shows an example of application of the semiconductor device 10 (FIG. 1) including the package (i.e., the laminated wiring structure 30) having the fan-out structure according to the above-mentioned embodiment, and shows the configuration (sectional structure) of the semiconductor device 10 when mounted on an interposer 60.

In the configuration of the interposer 60 shown in FIG. 5, wiring layers 62 and 63 are formed on both surfaces of an insulating base material 61, and the wiring layers 62 and 63 are interconnected via through holes formed at required positions in the insulating base material 61 (conductors filled into the through holes). Moreover, insulating layers 64 and 65 are formed on the insulating base material 61 and the wiring layers 62 and 63, and further, wiring layers 66 and 67 formed on the insulating layers 64 and 65 are connected with each other via conductors (which are formed by part of material which is included in the wiring layers 66 and 67, respectively) filled into via holes formed in the insulating layers 64 and 65. Namely, the interposer 60 has a structure in which the four wiring layers 62, 63, 66 and 67 are stacked one on top of another.

Additionally, a pad portion 66P is defined on the surface of the wiring layer on which the semiconductor device 10 is mounted (in the uppermost wiring layer 66 in the illustrated example), at a position corresponding to the position of the external connection terminal (the solder bump or the like) 38 of the semiconductor device 10, and a pad portion 67P is defined on the lowermost wiring layer 67 which is the opposite surface thereof, at a position corresponding to the position of a connection terminal (not shown) such as a solder bump for use in mounting on the motherboard or the like. Also, protection films (solder resist layers) 68 and 69 are formed on both surfaces of the interposer 60 to coat the entire surface but to expose the pad portions 66P and 67P of the wiring layers 66 and 67, and further, the pad portions 66P and 67P of the wiring layers exposed from the protection films 68 and 69 are plated with Ni and Au.

This structure (FIG. 5) can achieve the following advantages. Specifically, as previously mentioned, in the structure of the prior art package (wiring board or interposer), the package needs to have a considerable thickness (multiple layers) in order to reduce "warpage" resulting from a cure shrinkage in the underfill resin at the time of chip mounting, and also, the package generally has a multilayer structure under restrictions on the width of the wiring pattern or a via contact, in order to achieve the fan-out structure required for the package.

On the other hand, in the configuration of the semiconductor device 10 according to the present embodiment, as mentioned above, the wiring pattern (the wiring layer 31) is directly routed from each electrode terminal 21 of the semiconductor chip 20, and the routed wiring patterns are connected to the external connection terminals 38 or the pad portions 36P provided not only on the portion directly below the chip mounting area but also on the portion corresponding to the area outside the portion directly below the chip mounting area by the rewiring in the laminated wiring structure 30 (i.e., the fan-out structure). Therefore, when the semiconductor device 10 having such a fan-out structure built therein is connected to the interposer, the semiconductor device 10 can be connected to the interposer 60 having at most a four-layer structure such as shown in FIG. 5, so that the required fan-out structure can be achieved. Namely, the configuration shown in FIG. 5 eliminates a need for the package having a multi-layer wiring structure such as has been conventional, and thus enables contributing to reductions in manufacturing cost as well as in manufacturing time.

What is claimed is:

1. A semiconductor device comprising:
   a semiconductor chip including electrode terminal bumps;
   a laminated wiring structure formed integrally with the semiconductor chip in direct contact with the electrode terminal bumps;
   a frame disposed to surround the semiconductor chip on the laminated wiring structure, and made of a material having stiffness; and
   a sealing resin formed to bury therein the frame and at least the periphery of a side surface of the semiconductor chip, wherein a side surface of the laminated wiring structure is exposed from the sealing resin;
   wherein electrical paths extend from the electrode terminal bumps of the semiconductor chip to respective pad portions, the pad portions are located on a surface of the laminated wiring structure distal from the semiconductor chip, and the electrical paths consist of wiring internal to the laminated wiring structure;
   wherein the sealing resin is formed to coat a top surface and an inner side surface of the frame, and a side surface of the semiconductor chip, and to expose a surface of the semiconductor chip opposite to a surface thereof on which the electrode terminals are formed; and
   wherein an uppermost insulating layer of the laminated wiring structure is directly disposed on the surface of the semiconductor chip on which the electrode terminals are formed, and each of the electrode terminals is connected to a wiring layer which is formed to fill a corresponding via hole formed in the uppermost insulating layer.

2. The semiconductor device according to claim 1, comprising external connection terminals bonded to the pad portions.

3. The semiconductor device according to claim 1, wherein the frame is constituted of glass epoxy resin.

* * * * *